US009411915B2

(12) United States Patent
Bouzarkouna et al.

(10) Patent No.: US 9,411,915 B2
(45) Date of Patent: Aug. 9, 2016

(54) METHOD OF SELECTING POSITIONS OF WELLS TO BE DRILLED FOR PETROLEUM RESERVOIR DEVELOPMENT

(71) Applicant: IFP Energies nouvelles, Rueil-Malmaison (FR)

(72) Inventors: Zyed Bouzarkouna, Paris (FR); Didier Yu Ding, Le Pecq (FR); Anne Auger, Antony (FR)

(73) Assignee: IPF ENERGIES NOUVELLES, Rueil-Malmaison (FR)

( * ) Notice: Subject to any disclaimer, the term of this patent is extended or adjusted under 35 U.S.C. 154(b) by 594 days.

(21) Appl. No.: 13/857,186

(22) Filed: Apr. 5, 2013

(65) Prior Publication Data
US 2013/0268248 A1    Oct. 10, 2013

(30) Foreign Application Priority Data

Apr. 10, 2012    (FR) ...................................... 12 01057

(51) Int. Cl.
| G06F 17/10 | (2006.01) |
| G06G 7/48 | (2006.01) |
| G06G 7/50 | (2006.01) |
| G06F 17/50 | (2006.01) |
| G06Q 10/04 | (2012.01) |

(52) U.S. Cl.
CPC ............ *G06F 17/5009* (2013.01); *G06Q 10/04* (2013.01)

(58) Field of Classification Search
CPC .............................. G06F 17/5004; G06Q 10/04
USPC ........................................................ 703/9, 10
See application file for complete search history.

(56) References Cited

U.S. PATENT DOCUMENTS

| 6,549,879 | B1 * | 4/2003 | Cullick | .................. | E21B 49/00 |
| | | | | | 702/11 |
| 2005/0273303 | A1 * | 12/2005 | Flandrin | ................. | G06T 17/20 |
| | | | | | 703/10 |
| 2007/0073527 | A1 * | 3/2007 | Flandrin | ................. | G06T 17/20 |
| | | | | | 703/10 |
| 2010/0299125 | A1 | 11/2010 | Dig et al. | | |
| 2012/0059634 | A1 * | 3/2012 | Bouzarkouna | ......... | G06Q 10/04 |
| | | | | | 703/2 |
| 2012/0285701 | A1 * | 11/2012 | Cheng | ..................... | E21B 43/30 |
| | | | | | 166/369 |
| 2012/0316789 | A1 * | 12/2012 | Suarez-Rivera | ......... | G01V 9/00 |
| | | | | | 702/13 |

FOREIGN PATENT DOCUMENTS

EP    2 253 797 A1    11/2010

OTHER PUBLICATIONS

D Y Ding (Optimization of Well Placement using Evolutionary Algorithm, 2008 (18 pages).*
Oluwatoyin Badru, (Well-Placement optimization using the quality map approach, 2003 (62 pages)).*
Wang, Honggang, et al: "Use of Retrospective Optimization for Placement of Oil Wells Under Uncertainty", Winter Simulation Conference (WSC), Proceedings of the 2010, IEEE, Piscataway, NJ, USA, Dec. 5, 2010, pp. 1750-1757, XP031842679, ISBN: 978-1-4244-9866-6.

* cited by examiner

*Primary Examiner* — Kamini S Shah
*Assistant Examiner* — Andre Pierre Louis
(74) *Attorney, Agent, or Firm* — Fitch, Even, Tabin & Flannery LLP (57) ABSTRACT

A method of selecting the positions of wells to be drilled for the development of a petroleum reservoir from a set of reservoir images. Well configurations are optimized by calculating a first quality criterion using a flow simulator applied to a limited number of reservoir images. Previously obtained configuration simulation results previously obtained are used for configurations physically close to the configuration to be assessed. A second reservoir development quality criterion is calculated for the optimized configurations using a flow simulator applied to each image of the reservoir. Finally, the well location corresponding to the optimized configuration having the best second quality criterion is selected.

15 Claims, 7 Drawing Sheets

METHOD OF SELECTING POSITIONS OF WELLS TO BE DRILLED FOR PETROLEUM RESERVOIR DEVELOPMENT

CROSS-REFERENCE TO RELATED APPLICATION

Reference is made to French Application No. FR 12/01.057, filed Apr. 10, 2012, which application is incorporated herein by reference in its entirety.

BACKGROUND OF THE INVENTION

1. Field of the Invention

The present invention relates to the petroleum industry, and more particularly, to the optimization of the location of wells, or drainage zones, in a petroleum reservoir in order to produce hydrocarbons.

2. Description of the Prior Art

To produce a petroleum reservoir, reservoir engineers want to define the best positions and trajectories for the wells to be drilled, corresponding to the best drainage zones. These wells are generally production wells allowing hydrocarbons to be driven from the reservoir to the surface, or sometimes injection wells, for example water or gas injection wells, intended to improve the recovery of hydrocarbons contained in the reservoir.

Well drilling is an important decision in the life of a petroleum reservoir insofar as drilling a well is both time and cost consuming. Reservoir engineers therefore generally use two tools:

A first tool is referred to as "reservoir model" that provides an image representative of the structure of the reservoir and of the behavior thereof. This image or representation is constructed from data collected in the petroleum field being considered (cores, logs, seismic data, etc.) and obtained by geologists, geophysicists, petrophysicists and uses a programmed computer. However, in practice, geologists, geophysicists and petrophysicists do not have enough data for constructing a model on the computer that would perfectly correspond to the subsoil. The usual known approach therefore constructs several reservoir models representing different properties such as petrophysical properties for example. Each reservoir model is considered to be a possible image of the structure of the reservoir and of the behavior thereof. The uncertainty on the precise knowledge of the reservoir is thus accounted for by producing several possible reservoir images.

A second tool is referred to as "flow simulator". A flow simulator is software intended for modelling fluid flows within the petroleum reservoir represented by a reservoir model. For example, this software allows assessment, for a given well configuration and for a given time interval, the amounts of water, oil and gas produced. PumaFlow® (IFP Energies nouvelles, France) is an example of a commercially available flow simulator.

There are known techniques for optimizing the location of drainage zones using several possible reservoir models and a flow simulator.

The following methods are, for example, known:

Guyaguler, B. and Home, R. N. 2001. Uncertainty Assessment of Well Placement Optimization. In: SPE Annual Technical Conference and Exhibition. SPE 71625, Ozdogan, U. and Home, R. N. 2006. Optimization of Well Placement Under Time-Dependent Uncertainty. SPE Res Eval & Eng 9 (2): 135-145. SPE-90091-PA, Alhuthali, A. H., Datta-Gupta, A., Yuen, B. and Fontanilla, J. P. 2010. Optimizing Smart Well Controls Under Geologic Uncertainty. Journal of Petroleum Science and Engineering 73 (1-2): 107-121, Schulze-Riegert, R., Bagheri, M., Krosche, M., Kuck, N. and Ma, D. 2011. Multiple-Objective Optimization Applied to Well Path Design Under Geological Uncertainty. In SPE Reservoir Simulation Symposium. SPE 141712.

However, these approaches represent a long and burdensome process requiring a very large number of flow simulations using the flow simulator. Indeed, for each drainage zone configuration being considered, these methods perform a flow simulation for each possible reservoir model, and combine them afterwards using a quality criterion, conventionally defined as a parameter referred to as "Net Present Value" or NPV. The NPV is the cash flow difference generated by the investment corresponding to the drainage zones placement.

In order to meet the needs of engineers and of specialists in charge of the petroleum reservoir development, it is essential to reduce the number of flow simulations to optimize the placement of drainage zones on several possible reservoir models.

The following document describes a method for reducing the number of flow simulations:

Wang, H., Echeverria Ciaurri, D., Durlofsky, L. J. and Cominelli, A. 2011. Optimal Well Placement Under Uncertainty Using a Retrospective Optimization Framework. In: SPE Reservoir Simulation Symposium. SPE 141950-MS.

This method uses a limited number (selected by the engineer or the user of the method) of reservoir models at the start of the optimization stage, then it uses more and more (as selected by the engineer or the user of the approach) models according to the evolution of the optimization. In practice, it is difficult for the engineer to choose the number of models to be used in each stage or iteration of the method. Furthermore, during the last generations for each drainage zone configuration a large number (21 or 104 in the example presented) of possible reservoir models are considered and thus a large number of reservoir simulations for each drainage zone configuration. In practice, it is also very difficult to carry out this large number of flow simulations.

SUMMARY OF THE INVENTION

Thus, the invention relates to a method of optimizing the placement of wells from several possible reservoir models, wherein the number of flow simulations is limited. The method is based on the use of the results of the flow simulations conducted throughout the optimization procedure, and thus defines a new quality criterion that approximates the NPV but requires a limited number of (or even only one) flow simulations.

In general terms, the invention relates to a method of developing an underground reservoir from a set of images of the reservoir, wherein a number of wells to be drilled in the reservoir is defined. Well locations are determined by carrying out the following stages:

i) randomly generating well configurations with each configuration corresponding to possible well locations;

ii) optimizing the configurations by calculating a first reservoir development quality criterion using a flow simulator applied to a limited number of reservoir images and by use of configuration simulation results previously obtained for configurations disposed at a limited distance, to the configuration to be assessed with the limited distance being a function of the well coordinates;

iii) calculating, for the optimized configurations, a second reservoir development quality criterion using a flow simulator applied to each image of the reservoir, and selecting the well location corresponding to the optimized configuration having the best second quality criterion; and iv) drilling the wells at the selected locations.

According to the invention, the previously obtained configuration simulation results can be obtained during optimization, or by calculating the second quality criterion.

According to the invention, the first and second quality criteria can correspond to a net present value NPV characteristic of all the images of the reservoir. The second criterion C can then be calculated using the formula as follows:

$$C = \frac{1}{N_R} \sum_{1}^{N_R} C_i$$

with:

$C_i$ being the NPV resulting from a simulation associated with reservoir image i; and $N_R$ being the number of images of the reservoir.

The first criterion Q can then be calculated with the formula as follows:

$$Q = \sum_{j=1}^{N_M} p_j C_j + \sum_{i=1}^{N_S} \tilde{p}_i \tilde{C}_i$$

with:

$N_S$ being a number of configurations already simulated $N_M$ being a number of reservoir images considered, $N_M \leq N_R$, $N_R$ being the number of images of the reservoir $\tilde{C}_i$ being a simulation result corresponding to each of the $N_S$ configurations $C_j$ being a simulation result corresponding to the configuration in progress, for each one of the $N_M$ reservoir images considered $p_j$ being a weight assigned to each $C_j$ $\tilde{p}_i$ being a weight assigned to each $\tilde{C}_i$.

According to the invention, the procedure can be repeated by varying the number of wells, and the configurations can be optimized using an algorithm of CMA-ES type. Finally, the wells to be drilled can comprise multi-branch drains.

BRIEF DESCRIPTION OF THE DRAWINGS

Other features and advantages of the method according to the invention will be clear from reading the description hereafter of embodiments given by way of non limitative example, with reference to the accompanying figures wherein.

DETAILED DESCRIPTION OF THE INVENTION

The invention relates to a decision-making technique for well placement in a reservoir, while accounting for the uncertainty on the reservoir knowledge with a limited number of reservoir simulations. What is referred to as a "well" is any drainage zone. The method uses optimization of an approximate quality criterion allowing obtaining a satisfactory result as regards the true quality criterion (mean of the NPVs or of the drainage zone productions for all the reservoir models). The reduction in the number of reservoir simulations allows industrial application by reservoir engineers.

From a set of reservoir images (reservoir models), the underground reservoir development method according to the invention comprises the main stages as follows:

1. defining a number of wells to be drilled within the reservoir
2. randomly generating well configurations
3. optimizing the configurations by calculating a first quality criterion (approximate criterion)
4. calculating, for the optimized configurations, a second quality criterion (true criterion)
5. drilling the wells at the selected locations.

A set of reservoir models (reservoir images) corresponding each to a grid defined by the reservoir properties, such as porosity, permeability, etc., is first defined. These models are constructed from measurements collected in the reservoir by a geostatistical method.

A flow simulator is also selected. For example, the PumaFlow™ software (IFP Energies nouvelles, France) can be used.

1. Defining the Number of Wells to be Drilled within the Reservoir

The number of wells to be drilled within the reservoir is defined in this stage. These wells define drainage zones. The type of each well, production or injection well, is defined in this stage. The type of fluid to be injected (water, gas, etc.) is also defined for injection wells.

2. Randomly Generating Well Configurations

A well configuration corresponds to the location, within the reservoir, of all the wells to be drilled in the reservoir.

A parameter λ referred to as population size and characterizing the number of well configurations used for each generation is defined. The initial population (first iteration) is randomly generated.

The well configuration is represented by the location of each well within the reservoir. It can be the coordinates of the points defining the ends, within the reservoir, of the wells and their lateral drains. The dimension of the problem is thus equal to the number of variables used to represent the well configuration.

3. Optimizing the Configurations by Calculating an Approximate Quality Criterion 3.1 Selecting an Approximate Reservoir Development Quality Criterion The reservoir development quality is conventionally defined as a parameter referred to as Net Present Value or NPV. The NPV is the cash flow difference generated by the investment corresponding to the drainage zones placement.

In this stage, a reservoir development quality criterion replacing the true quality criterion of stage 4.1 is defined.

The approximate reservoir development quality is calculated using a limited number of new flow simulations and a number of results of already existing simulations with other drainage zone configurations that are close to the configuration considered. Thus, a first reservoir development quality criterion is calculated using a flow simulator applied to a limited number of reservoir images and by use of configuration simulation results previously obtained for configurations close in terms of a distance to the configuration to be assessed with the distance being a function of the well coordinates.

The previously obtained configuration simulation results are obtained during optimization or by calculating a second quality criterion (see stage 4.1).

Indeed, for a given drainage zone configuration, the following stages are carried out:

3.1.1 selecting a number $N_N$ (Number of neighboring points) of drainage zone configurations that are the closest in distance to the drainage zone configuration being considered. These $N_N$ configurations are selected among the drainage zone configurations already simulated with a flow simulator. The number of already simulated drainage zone configurations for which the flow simulation results are available is denoted by $N_S$, with $N_N$ being less than or equal to $N_S$. The corresponding simulation results for each drainage zone configuration selected are denoted by $\tilde{C}_i$. Typically, $N_N$ is equal to min $(2^*N_R, N_S)$;

3.1.2 randomly selecting a number $N_M$ of reservoir models with a flow simulation of the drainage zone configuration under consideration being performed on each model. The simulation results corresponding to each drainage zone configuration being considered for each reservoir model that is selected are denoted by $C_j$. Typically, $N_M$ is equal to 1. This means that a single flow simulation is carried out;

3.1.3 selecting a weight assignment function for the various quality criteria, that is associating a weight value with each simulation result $\tilde{C}_i$ or $C_j$. The weight values are normalized between 0 and 1. Typically, the weight values corresponding to results $C_j$ are greater than those corresponding to results $\tilde{C}_i$. Typically also, the weight values corresponding to results $C_j$ are equal. And typically, the weight values corresponding to results $\tilde{C}_i$ have to be decreasing as a function of the distance of the configuration selected to the configuration being considered. The $N_M$ weight values corresponding to each $C_j$ and the $N_S$ values corresponding to each $\tilde{C}_i$ are hereafter denoted by $p_j$ and $\tilde{p}_i$ respectively.

In particular, one means of defining the $N_M$ weight values $p_j$ and the $N_S$ values of $\tilde{p}_i$ defining a maximum distance referred to as selection distance and equal to h (equal to 4000 for example). Then, for each $\tilde{p}_i$, the distance between the configuration selected and the configuration being considered is denoted by $d_i$. $p_j$ and $\tilde{p}_i$ can thus be defined as follows:

$$p_j \leftarrow 1, \text{ for } j = 1, \ldots, N_M$$

$$\tilde{p}_i \leftarrow \left(1 - \left(\frac{d_i}{h}\right)^2\right)^2, \text{ for } i = 1, \ldots, N_S$$

$$S = \sum_{j=1}^{N_M} p_j + \sum_{i=1}^{N_S} \tilde{p}_i$$

$$p_j \leftarrow \frac{p_j}{S}$$

$$\tilde{p}_i \leftarrow \frac{\tilde{p}_i}{S}$$

3.1.4 defining the approximate reservoir development quality criterion denoted by Q as follows:

$$Q = \sum_{j=1}^{N_M} p_j C_j + \sum_{i=1}^{N_S} \tilde{p}_i \tilde{C}_i$$

Defining the quality criterion uses, for a given drainage zone configuration, only $N_M$ flow simulation. Typically, as mentioned above, $N_M$ is equal to 1.

3.2 Optimization

In this stage, the approximate reservoir development quality criterion as defined in stage 3.1 is optimized using a stochastic optimization algorithm. This algorithm can for example be a CMA-ES (Covariance Matrix Adaptation—Evolution Strategy) type algorithm described in:

N. Hansen and A. Ostermeier. 2001. Completely Derandomized Self-adaptation in Evolution Strategies. Evolutionary Computation, 9(2):159-195.

According to an embodiment, the algorithm is initialized from the well configurations obtained in stage 2, and the parameters of the optimization that are defined by the well configuration parameters are modified using the optimization algorithm to maximize the approximate reservoir development quality criterion as defined in stage 3.1. This stage continues until a fixed stopping criterion that can concern in practice a maximum number of reservoir simulations to be carried out is reached.

4. Selecting the Best Locations for Each Well

For the configurations optimized in the previous stage, a second reservoir development quality criterion is calculated using a flow simulator applied to each reservoir image and the location of the wells corresponding to the optimized configuration having the best second quality criterion is selected.

4.1 Calculating a Second Quality Criterion (True Criterion)

For a number $N_R$ of reservoir models, the NPV can be defined for a given drainage zone configuration as a mean of the NPVs in all the reservoir models defined in stage 1.

It is also possible to use another quality form such as, for example, the difference between the mean of the NPVs in all the reservoir models and the standard deviation of the NPVs in all the reservoir models.

In general, the reservoir development quality criterion denoted by C is assessed as follows:

$$C = \frac{1}{N_R} \sum_{1}^{N_R} C_i,$$

with $C_i$ the simulation result associated with reservoir model i. Typically, C corresponds to the NPV and each $C_i$ corresponds to a NPV assessed with a given reservoir model. Calculating a value of $C_i$ requires a flow simulation.

In general, calculating the reservoir development quality criterion allowing measurement of the quality of a given drainage zone configuration thus requires a number of flow simulations equal to the number of reservoir models considered that is equal to $N_R$.

4.2 Selecting the Best Locations for Each Well

In this stage, a number of locations for each drainage zone candidate to be among the best locations browsed in the previous stage is first selected. One approach selects the best location obtained at each iteration. Another approach can, for example, select only the best location obtained at each generation if it represents the best one among all the points browsed (prior to this generation) throughout the previous stage.

Once location candidates are selected to be the best locations, flow simulations are performed for each location selected with all the reservoir models and the quality criterion is calculated as defined in stage 4.1.

One of the locations defined in the previous stage is then selected. Generally, this takes the drainage zone configuration having the best quality criterion and that can technically be drilled.

5. Drilling the Wells at the Selected Locations

In this stage, the wells defined in the previous stage are drilled.

Application Example

The method intended for well placement in an uncertain reservoir according to the invention can be used for placing new wells or for adding new laterals to existing wells. It can be applied to new fields or mature fields (containing already drilled wells). The reservoir uncertainty is defined using a number of equiprobable reservoir models. Presented here in particular is an application example for the placement of a production well and an injection well in a new field with 20 possible reservoir models.

Figure 1:
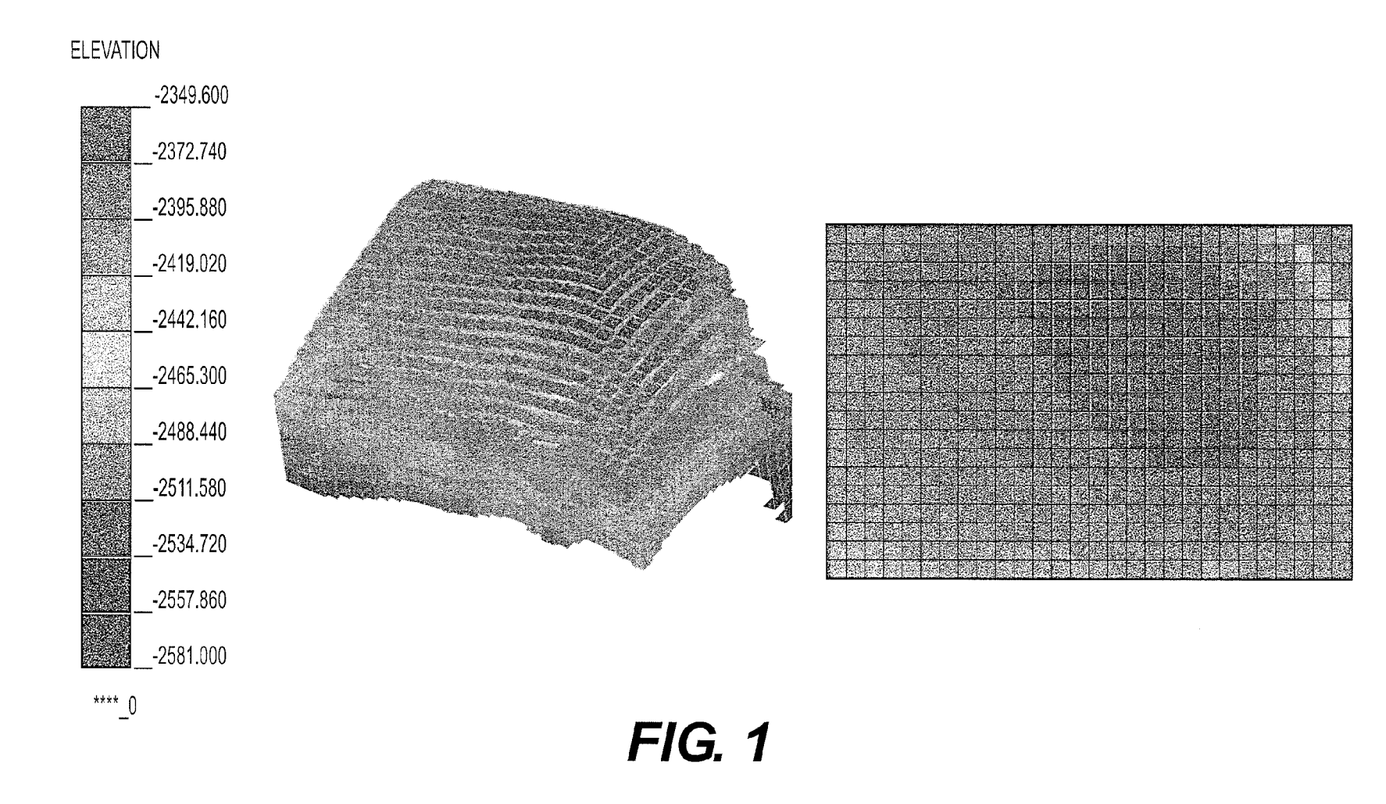
FIG. 1 shows the reservoir grid being used which comprises a perspective view of the reservoir and a top view and shows the vertical elevation of the reservoir.

This method is applied to a synthetic reservoir. The reservoir dimensions are 3420 m×5040 m×90 m. The Cartesian grid has 19 cells in direction x, 28 cells in direction y and 5 cells in direction z. The size of the cells is 180 m×180 m×18 m. FIG. 1 shows the reservoir grid used. It comprises a perspective view of the reservoir and a top view, and it shows the vertical elevation of the reservoir.

The field being considered contains no already drilled wells. The objective is to find the best placement for each one of the two wells with only one main trunk (without laterals) with the method according to the invention. The true quality criterion C is selected as the mean NPV value of the 20 reservoir models:

$$C = \frac{1}{20} \sum_{m=1}^{20} \left( \sum_{n=1}^{Y} \left( \frac{1}{(1+APR)^n} [Q_{n,o} \times C_{n,o} + Q_{n,g} \times C_{n,g} + Q_{n,wa} \times C_{n,wa}] \right) - C_d \right)_m$$

where $Q_{n,p}$ is the production of the field considered in phase p during period n in reservoir model m, $C_{n,p}$ is the gain or the loss associated with the production of phase p during period n, phase p can represent oil, gas or water, denoted by o, g, wa respectively. APR is the annual percentage rate. Y is the number of periods considered, $C_d$ is the cost required for drilling and completion of the wells considered, $C_d$ is approximated as follows:

$$C_d = \sum_{k=0}^{N} [A \cdot d_w \cdot \ln(l_w) \cdot l_w]_k$$

with $l_w$ the well length, $d_w$ the well diameter, A a constant and N the total number of wells.

The productions $Q_{n,p}$ of phase p for period n in reservoir model m are obtained using the reservoir simulator. In this example, the reservoir simulator used is the PumaFlow™ (IFP Energies nouvelles, France).

In this example, N=2. The constants used for defining the objective function are given in the table below:

| Constant | Value |
| --- | --- |
| $C_{n,o}$ | 60 \$/barrel |
| $C_{n,g}$ | −4 \$/barrel |
| $C_{n,w}$ | 0 |
| APR | 0.2 |
| A | 1000 |
| $d_w$ | 0.1 m |

The limit pressures are imposed at the bottom of these two wells.

The CMA-ES optimization algorithm is used to optimize the 12 parameters representing the 2 wells (6 parameters per well corresponding to the coordinates of the ends of each well). A population size equal to 40 individuals is selected.

An approximate quality criterion $\tilde{C}$ is defined. To calculate $\tilde{C}$ for a given drainage zone configuration, a number $N_S$ of already simulated drainage zone configurations is first selected. This number is equal to 40 maximum, and it corresponds to the number of drainage zone configurations with a distance equal to 4000 maximum. The distance between two well configurations $q_1$ and $q_2$ is calculated as follows:

$$d(q_1, q_2) = \sqrt{(q_1-q_2)^T C^{-1}(q_1-q_2)} \, \forall q_1, q_2 \in \mathfrak{R}^n.$$

The NPV values of the $N_S$ drainage zone configurations selected are denoted by $\tilde{C}_i$, i=1, ..., $N_S$, and the distances between each one of the $N_S$ drainage zone configurations selected and the drainage zone configuration to be assessed is denoted by $d_i$.

A single reservoir simulation is then carried out for the drainage zone configuration to be assessed using a randomly selected reservoir model, and the NPV value corresponding to this simulation is denoted by $C_1$.

The approximate quality criterion is thus calculated as:

$$Q = p_1 C_1 + \sum_{i=1}^{N_S} \tilde{p}_i \tilde{C}_i$$

with: $p_1$ and $\tilde{p}_i$ calculated and normalized as follows:

$$p_1 \leftarrow 1,$$

$$\tilde{p}_i \leftarrow \left(1 - \left(\frac{d_i}{h}\right)^2\right)^2, \text{ for } i = 1, \ldots, N_S$$

$$S = p_1 + \sum_{i=1}^{N_S} \tilde{p}_i$$

$$p_1 \leftarrow \frac{p_1}{S},$$

$$\tilde{p}_i \leftarrow \frac{\tilde{p}_i}{S}$$

If no drainage zone configuration has been selected (in cases where no drainage zone configuration has been simulated yet or if the distance from all the drainage zones already simulated to the drainage zone configuration to be assessed is greater than 4000), the approximate quality criterion is simply equal to $C_1$.

The initial population (of size 40) is randomly sampled in the reservoir. The best initially obtained approximate quality criterion value is 7.84E9. Optimization of the approximate quality criterion uses 7000 reservoir simulations to reach an approximate quality criterion value equal to 1.16E10.

Figure 2:
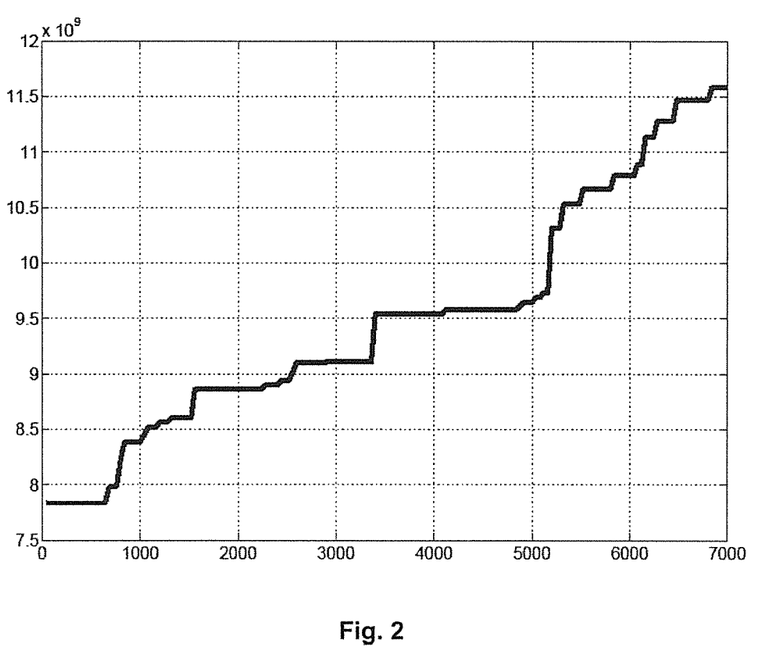
FIG. 2 shows the evolution of the best approximate quality criterion value obtained using the method according to the invention with the x-axis showing the number of reservoir simulations used and the y-axis showing the value of the approximate quality criterion.

During the optimization process, the method according to the invention succeeds in finding a series of drainage zone configurations, that is, with a better approximate quality criterion. FIG. 2 shows the evolution of the best approximate quality criterion value found using the method according to the invention. The x-axis shows the number of reservoir simulations used. The y-axis shows the value of the approximate quality criterion. Thirty drainage zone configurations are finally selected from the optimization performed. A drainage zone configuration is selected if its approximate quality criterion value represents the best value found during the optimization process.

Twenty reservoir simulations are carried out for each drainage zone configuration selected, that is for each reservoir model. Thus, 600 (=20×30) reservoir simulations are performed.

Figure 3:
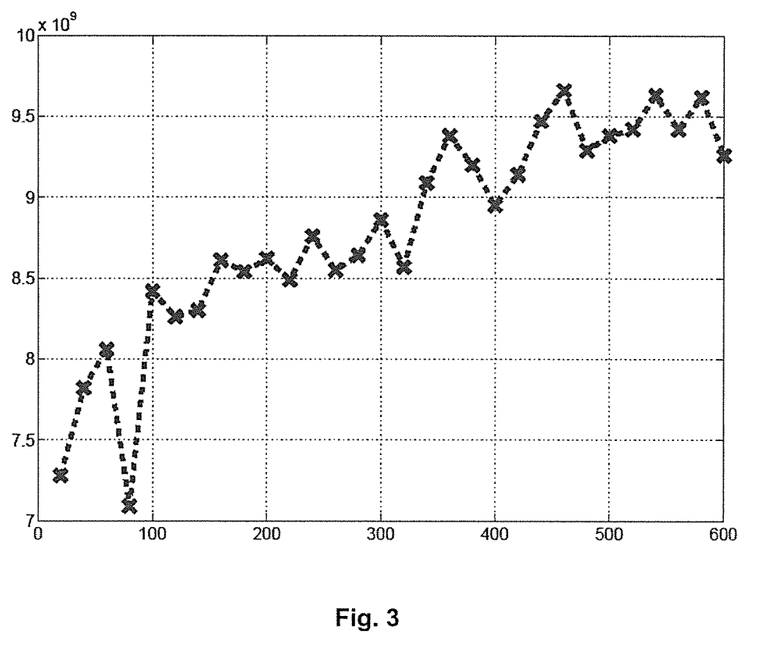
FIG. 3 shows the evolution of the best true quality criterion value obtained using the method according to the invention with the x-axis showing the number of reservoir simulations used and the y-axis showing the value of the true quality criterion.

The results of the 30 true quality criterion assessments for the drainage zone configurations selected are given in FIG. 3. This figure shows the evolution of the best true quality criterion value found using the method according to the invention. The x-axis shows the number of reservoir simulations used. The y-axis shows the value of the true quality criterion. Each point of the curve corresponds to 20 reservoir simulations performed.

Figure 4:
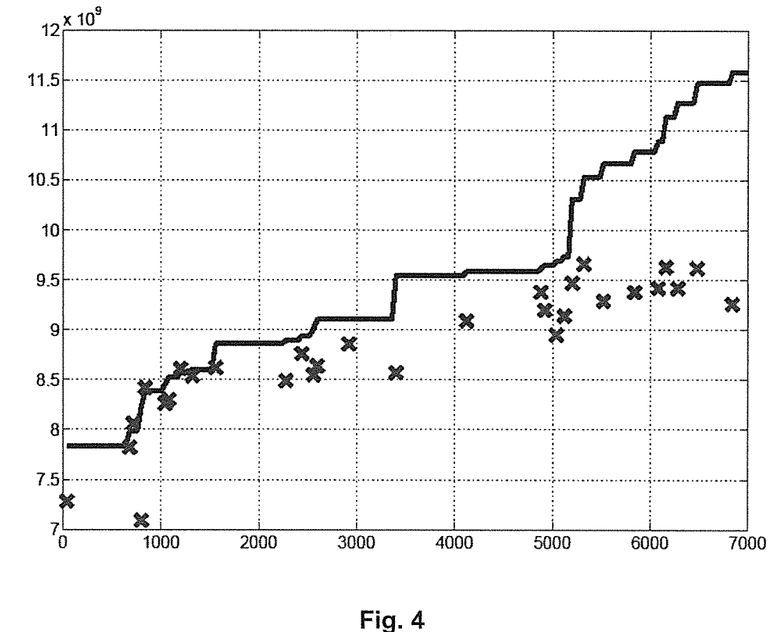
FIG. 4 shows the evolution of the best approximate quality criterion value obtained using the method according to the invention with the points corresponding to each assessment of the true quality criterion, the x-axis showing the number of reservoir simulations being used and the y-axis showing the value of the quality criterion (approximate or true)

The results of the 30 true quality criterion assessments are shown in FIG. 4, together with the results of the approximate criterion assessments. This figure shows the evolution of the best approximate quality criterion value found using the method according to the invention. The points correspond to each true quality criterion assessment. The x-axis shows the number of reservoir simulations used. The y-axis shows the value of the quality criterion (approximate or true).

The method according to the invention thus allows obtaining a better value for the true quality criterion (NPV mean for all the reservoir models) equal to 9.66E9.

With this method, a better drainage zone configuration can be obtained with a technically reasonable number of reservoir simulations.

Figure 5:
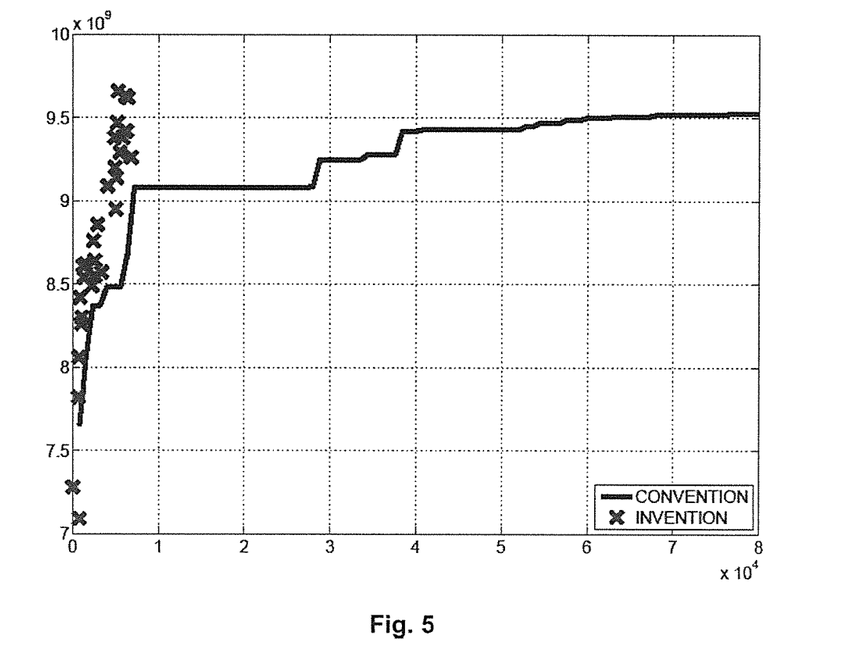
FIG. 5 shows the evolution of the best NPV value obtained using the method according to the invention and compares it with the one obtained using the conventional approach, the x-axis showing the number of reservoir simulations being used and the y-axis shows the NPV value.
Figure 6:
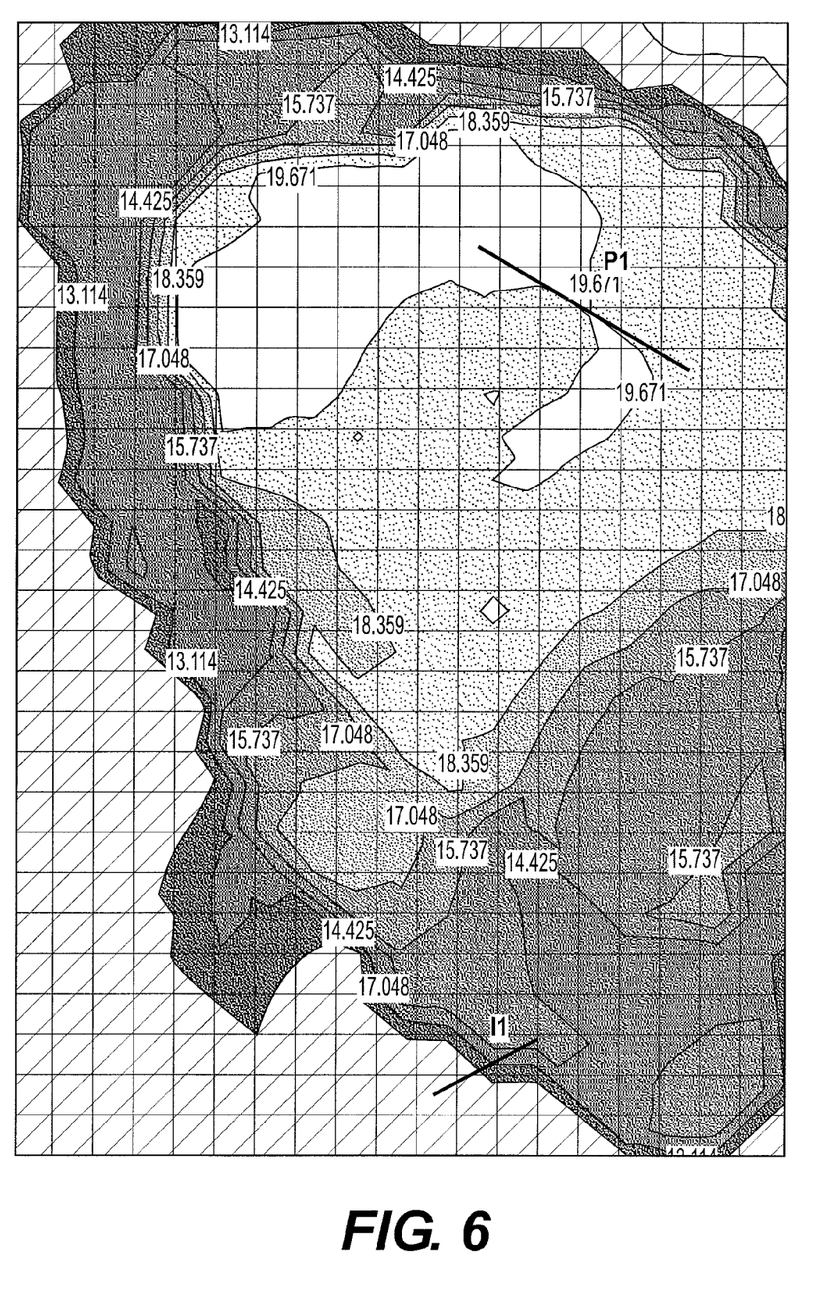
FIG. 6 is a top view of the reservoir grid showing the locations of the wells to be drilled obtained using the method according to the conventional approach with the production well denoted by P1 and the injection well denoted by I1.
Figure 7:
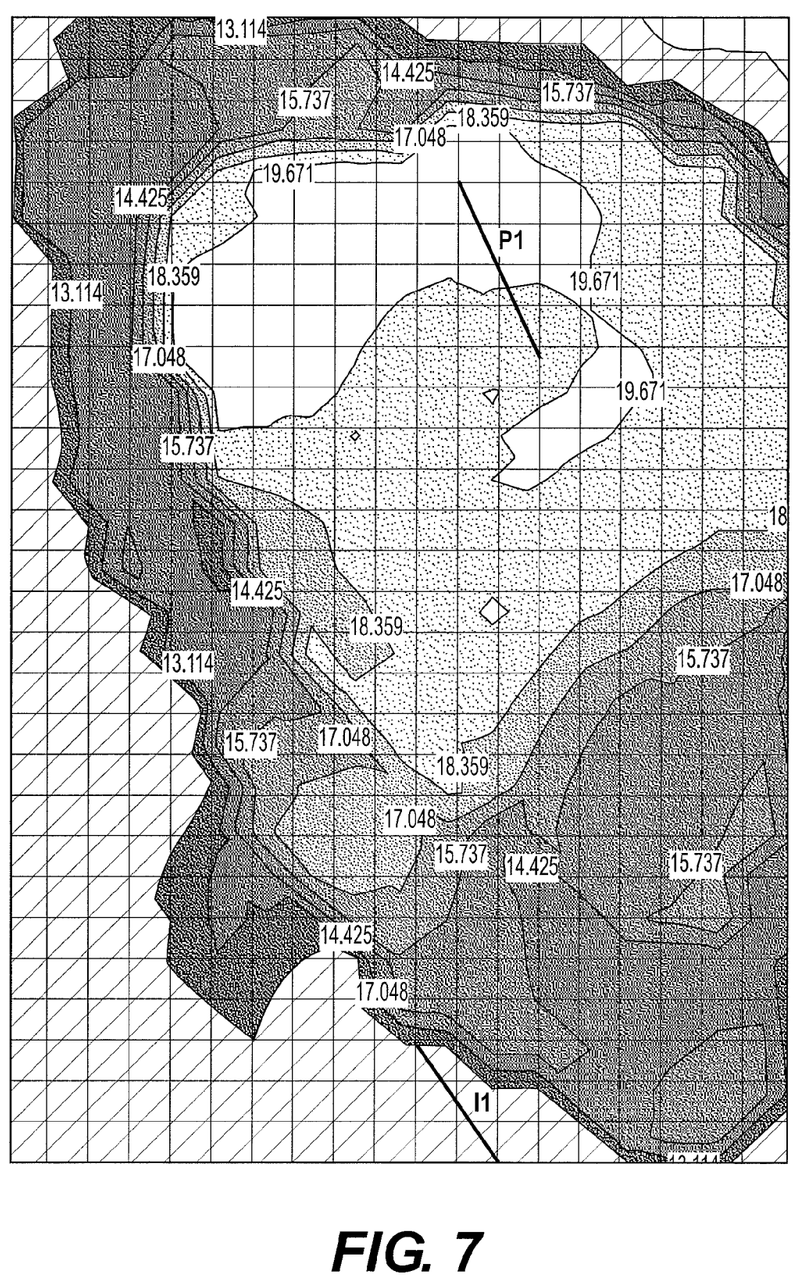
FIG. 7 is a top view of the reservoir grid showing the locations of the wells to be drilled obtained using the method according to the invention and the production well denoted by P1 and the injection well denoted by I1.

It is also shown that the method according to the invention is almost 16 times as fast (16 times less in number of simulations) as the conventional method. FIG. 5 shows the evolution of the best NPV value found using the method according to the invention and compares it with the one found using the conventional approach. The x-axis shows the number of reservoir simulations being used. The y-axis shows the NPV value. In this application example, the conventional method is based on a CMA-ES-based optimization of the true quality criterion. FIG. 6 shows the positions of the drainage zone configurations obtained using the conventional method. FIG. 7 shows the positions of the drainage zone configurations obtained using the method according to the invention. The drainage zone positions are close and the quality criterion values are equivalent, but much less time is required to determine the drainage zone according to the invention.

The invention claimed is:

1. A method of developing an underground reservoir from a set of images of the reservoir wherein a number of wells to be drilled in the reservoir is defined and locations are determined for the wells comprising:
   i) randomly generating well configurations with each configuration corresponding to possible well locations;
   ii) optimizing the configurations by calculating a first reservoir development quality criterion using a flow simulator applied to a limited number of reservoir images and by configuration simulation results previously obtained for configurations located within a distance to the configuration to be assessed with the distance being a function of the well coordinates;
   iii) calculating, for the optimized configurations, a second reservoir development quality criterion using a flow simulator applied to each image of the reservoir and selecting the well location corresponding to the optimized configuration having the best second quality criterion; and
   iv) drilling the wells at the selected locations; and wherein the first and second quality criteria correspond to a net present value characteristic of all images of the reservoir; and
   a first criterion Q is calculated using a formula as follows:

$$Q = \sum_{j=1}^{N_M} p_j C_j + \sum_{i=1}^{N_S} \tilde{p}_i \tilde{C}_i$$

with:
NS being a number of configurations already simulated
NM being a number of reservoir images considered, $N_M \leq N_R$, NR being the number of images of the reservoir
$\tilde{C}_i$ being a simulation result corresponding to each of the NS configurations
Cj being simulation result corresponding to the configuration in progress, for each one of the NM reservoir images considered
pj being a weight assigned to each Cj
$\tilde{p}_i$ being a weight assigned to each $\tilde{C}_i$.

2. A method as claimed in claim 1, wherein the previously obtained configuration simulation results are obtained during optimization.

3. A method as claimed in claim 1, wherein the previously obtained configuration simulation results are obtained by calculating the second quality criterion.

4. A method as claimed in claim 1, wherein a second criterion C is calculated using the formula as follows:

$$C = \frac{1}{N_R} \sum_{1}^{N_R} C_i$$

with:
Ci being a net present value resulting from a simulation associated with reservoir image I; and
NR being a number of images of the reservoir.

5. A method as claimed in claim 1, wherein the procedure is repeated by varying the number of wells.

6. A method as claimed in claim 1, wherein the configurations are optimized by a CMA-ES algorithm.

7. A method as claimed in claim 2, wherein the configurations are optimized by a CMA-ES algorithm.

8. A method as claimed in claim 3, wherein the configurations are optimized by a CMA-ES algorithm.

9. A method as claimed in claim 4, wherein the configurations are optimized by a CMA-ES algorithm.

10. A method as claimed in claim 1, wherein the wells to be drilled comprise multi-branch drains.

11. A method as claimed in claim 2, wherein the wells to be drilled comprise multi-branch drains.

12. A method as claimed in claim 3, wherein the wells to be drilled comprise multi-branch drains.

13. A method as claimed in claim 4, wherein the wells to be drilled comprise multi-branch drains.

14. A method as claimed in claim 5, wherein the wells to be drilled comprise multi-branch drains.

15. A method as claimed in claim 6, wherein the wells to be drilled comprise multi-branch drains.

\* \* \* \* \*